United States Patent [19]

Okawa et al.

[11] Patent Number: 5,459,371

[45] Date of Patent: Oct. 17, 1995

[54] MULTILAYER PIEZOELECTRIC ELEMENT

[75] Inventors: Yasuo Okawa; Yasuo Imoto, both of Nagoya, Japan

[73] Assignee: Brother Kogyo Kabushiki Kaisha, Nagoya, Japan

[21] Appl. No.: 213,170

[22] Filed: Mar. 14, 1994

[30] Foreign Application Priority Data

Mar. 12, 1993 [JP] Japan ..................................... 5-051825
Mar. 26, 1993 [JP] Japan ..................................... 5-068494

[51] Int. Cl.⁶ ............................................. H01L 41/08
[52] U.S. Cl. ........................ 310/363; 310/328; 310/364; 310/366
[58] Field of Search .................................. 310/328, 363, 310/364, 366

[56] References Cited

U.S. PATENT DOCUMENTS

| | | | |
|---|---|---|---|
| 3,743,773 | 7/1973 | Sobel | 178/7.3 |
| 4,460,842 | 7/1984 | Waanders et al. | 310/338 |
| 4,523,121 | 6/1985 | Takahashi et al. | 310/334 |
| 4,523,121 | 6/1985 | Takahashi et al. | 310/334 |
| 4,786,837 | 11/1988 | Kalnin et al. | 310/364 |
| 5,118,982 | 6/1992 | Inoue et al. | 310/366 |
| 5,153,477 | 10/1992 | Jomura | 310/328 |
| 5,254,212 | 10/1993 | Someji et al. | 156/630 |
| 5,306,980 | 4/1994 | Montgomery | 310/333 |

OTHER PUBLICATIONS

Japanese Laid–Open Patent Publication No. SHO 62–211974.
Japanese Laid–Open Patent Publication No. SHO 63–17354.

*Primary Examiner*—Thomas M. Dougherty
*Attorney, Agent, or Firm*—Kane, Dalsimer, Sullivan, Kurucz, Levy, Eisele and Richard

[57] ABSTRACT

Disclosed is a multilayer piezoelectric element in which the anisotropic conductive layers are formed on two side surfaces, each surface opposing with each other, of the multilayer piezoelectric element that a plurality of the piezoelectric plates and the internal electrodes are alternately stacked and the conductive portions are alternately formed in the anisotropic conductive layer corresponding to the internal electrodes disposed on each side surface, thereby the internal electrodes and the external electrodes are electrically connected with each other on each side surface through the conductive portions. And further, it is disclosed a multilayer piezoelectric element in which the conductive protrusions are alternately formed by nickel plating at ends of the internal electrodes disposed on both two side surfaces of the multilayer piezoelectric element in which a plurality of the piezoelectric plates and the internal electrodes are alternately stacked and the anisotropic conductive layers are formed over both side surfaces and further the conductive portions are partially formed in the anisotropic conductive layers by selectively pressing thereof through the conductive protrusions, thereby the internal electrodes and the external electrodes are electrically connected with each other through the conductive protrusions and the conductive portions.

14 Claims, 8 Drawing Sheets

MULTILAYER PIEZOELECTRIC ELEMENT

BACKGROUND OF THE INVENTION

1. Field of the Invention

The present invention relates to a multilayer piezoelectric element constructed from a plurality of thin piezoelectric layers which are stacked with each other in a vertical direction, through which it can be obtained displacement in the vertical direction (stacked direction) when a voltage is applied thereto.

2. Description of Related Art

In general, when a multilayer piezoelectric element is produced, it is necessary that internal electrodes positioned between piezoelectric layers are alternately connected by an external electrode at a side surface of the element. Here, in case that the multilayer piezoelectric element is produced according to a conventional method through which a condenser type of the piezoelectric element is produced, an area of the internal electrode becomes narrower than a sectional area (surface area) of the element, thereby an electric field cannot be generated over the sectional area thereof. As a result, it is obstructed that the multilayer piezoelectric element suitably displaces according to its characteristic and displacing force is concentrated on an uneven portion in the element, thereby the multilayer piezoelectric element is apt to be destroyed.

Further, it is difficult to position and stack each of the piezoelectric layers with correct relationship thereamong when the piezoelectric layers are stacked with each other. And on the basis of difficulty in both positioning and stacking of the piezoelectric layers, there is a limit that the several tens of the piezoelectric layers can only be multilayered at best. Thereby, since the displacement quantity of the piezoelectric element proportions to a multilayered number of the piezoelectric layers when the same voltage is applied thereto, it is very difficult to produce the piezoelectric element having larger displaceability.

In order to dissolve the above problem, it is proposed a method in which the multilayer piezoelectric element is produced by multilayering the piezoelectric layers on each surface of which the internal electrode is printed thereover. Here, in the multilayer piezoelectric element produced according to the above, the area of the internal electrode on the piezoelectric layer is as same as the sectional area of the multilayer piezoelectric element. In such construction of the piezoelectric element, in order to alternately connect the internal electrodes through the external electrode, it is necessary to conduct an insulating process according to methods , for example, disclosed in U.S. Pat. No. 4,523,121 (corresponding to FIG. 10) and Japanese Patent Application Laid Open No. 62-211,974 (corresponding to FIG. 11).

Here, it will be described methods of U.S. Pat. No. 4,523,121 and Japanese Patent Application, referring to FIGS. 10 and 11. That is to say, in the electrostrictive element disclosed in FIG. 10, insulative layers 71 composed of glass are alternately formed on both side surfaces of the element by screen printing method or cataphoresis method and thereafter baking. And further, silver paste is coated on the both side surfaces of the element so as to form external electrodes 72. As a result, on each side surface of the element, internal electrodes 73 are alternately connected through the external electrodes 72.

In the laminated piezoelectric element disclosed in FIGS. 11(a) and 11 (b), insulative layers 81 composed of glass are formed on a side surface of the element by screen printing method or cataphoresis method and thereafter baking and internal electrodes 83 are alternately connected to external electrodes 82 formed on the insulative layers 81 so as to partially overlap with each other.

However, as understandable from FIGS. 10 and 11, in the elements shown in FIGS. 10, 11, two additional processes are necessitated to produce the elements. The first process is to form the insulative layers 71, 81 on the side surface(s) of the elements. And the second process is to form the external electrodes 72, 82 over the insulative layers 71, 81 in order to connect both the internal electrodes 73, 83 and the external electrodes 72, 82. And further in both cases, the first process and the second process cannot be conducted at the same time since the insulative layers 71, 81 are formed and thereafter the external electrodes 72, 82 are formed. Thus, there is a problem that more processes are necessary.

And in case of the electrostrictive element of FIG. 10, the insulative layers 71 are alternately formed on the end portions of the internal electrodes 73, the end portions thereof being exposed on the side surfaces of the element. But, in case that the insulative layers 71 are formed by using the screen printing method, it is necessary to precisely determine printing positions of the insulative layers 71. Therefore, it will be possible that deviation of the printing positions occurs and grazing or running of the insulative layers 71 occurs. Based on such deviation, grazing or running of the insulative layers 71, there is a problem that portions which are to be connected are not efficiently connected and on the other hand, portions which are to be insulated are unnecessarily connected. Further, in case that the insulative layers 71 are formed by using the cataphoresis method, it is difficult to uniformly form the insulative layers 71 which have a thickness to be able to resist drive voltage applied to the element, therefore there is a problem that portions which are to be insulated are connected due to dielectric breakdown.

On the other hand, in case of the piezoelectric element disclosed in FIG. 11, though it is comparatively easy to form the insulative layers 81, however, it is difficult to connect the external electrodes 82 and the internal electrodes 83. For instance, if the screen printing method is utilized, it is difficult to uniformly coat the conductive paste (silver paste) on a portion having difference in level, which occurs between the side surface of the element and the surface of the insulative layers 81, in addition to the problem that it is unable to precisely determine the printing positions. Thus, there is a problem that portions which are to be connected are not efficiently connected and on the other hand, portions which are to be insulated are unnecessarily connected.

And further, even if the screen printing method or the cataphoresis method is utilized to form the insulative layers 71, 81, it is necessary an additional process to bake the insulative layers 71, 81 and the conductive paste resulting the external electrodes 72, 82. Therefore, producing cost of the element becomes higher.

SUMMARY OF THE INVENTION

It is accordingly an object of the present invention to overcome the above mentioned problems and to provide a multilayer piezoelectric element through which not only it can simplify process to produce the multilayer piezoelectric element by omitting a process to form insulative layers but also it can reliably connect external electrodes and internal electrodes without precise positioning thereof, thereby it can prevent conductive inferiority and insulative inferiority from being yielded.

In order to overcome the above object, the first invention provides a multilayer piezoelectric element having a first and a second side surfaces opposing with each other in which a plurality of piezoelectric layers and a plurality of internal electrodes are alternately stacked with each other, the multilayer piezoelectric element comprising:

a pair of anisotropic conductive layers which are formed on the first and the second side surfaces of the multilayer piezoelectric element so as to cover the internal electrodes exposed on the first and the second side surfaces, the anisotropic conductive layer having a capability for becoming conductive only at points where selectively pressed and having conductive portions formed therein by being selectively pressed through a pressing device; and a pair of external electrodes which are formed on the anisotropic conductive layers on both the first and the second side surfaces, the external electrode being electrically connected to the internal electrodes through the conductive portions formed in the anisotropic conductive layer.

According to the first invention, the multilayer piezoelectric element can be obtained by only forming the anisotropic conductive layers and the external electrodes on both the first and the second side surfaces of the element, thereby construction of the multilayer piezoelectric element can be simplified. Therefore, it can omit both step for forming the insulative layer and step for baking thereof to manufacture the multilayer piezoelectric element. As a result, manufacturing cost of the multilayer piezoelectric element can be reduced. And since the internal electrodes are electrically connected to the external electrodes through the conductive portions formed in the anisotropic conductive layer by selectively pressing thereof, it is not necessary the conductive paste to form the external electrodes or to connect both the internal electrodes and the external electrodes, thereby it can prevent conducive inferiority and insulative inferiority from being yielded.

And further the second present invention provides a multilayer piezoelectric element having a first and a second side surfaces opposing with each other in which a plurality of piezoelectric layers and a plurality of internal electrodes are alternately stacked with each other, the multilayer piezoelectric element comprising:

a plurality of conductive protrusions alternately formed at end positions of the internal electrodes exposed on both the first and the second side surfaces;

pair of anisotropic conductive layers which are formed on the first and second side surfaces of the multilayer piezoelectric element so as to cover the internal electrodes exposed on the first and second side surfaces, the anisotropic conductive layer having a capability for becoming conductive only at points where selectively pressed and having conductive portions formed therein by being selectively pressed through a pressing device; and a pair of external electrodes which are formed on the anisotropic conductive layers on both the first and the second side surfaces, the external electrode being electrically connected to the internal electrodes through the conductive protrusions and the conductive portions.

According to the second invention, the multilayer piezoelectric element can be obtained by only forming the anisotropic conductive layers and the external electrodes on both the first and the second side surfaces of the element, thereby construction of the multilayer piezoelectric element can be simplified. Therefore, it can omit both step for forming the insulative layer and step for baking thereof to manufacture the multilayer piezoelectric element. As a result, manufacturing cost of the multilayer piezoelectric element can be reduced.

And in particular, the internal electrodes and the external electrodes can be connected with each other by forming the conductive portions in the anisotropic conductive layers while selectively pressing the anisotropic conductive layers through the conductive protrusions formed on both the first and the second side surfaces corresponding to the internal electrodes. Therefore, the internal electrodes and the external electrodes can be connected without precise positioning thereof.

And further, since the internal electrodes are electrically connected to the external electrodes through the conductive portions formed in the anisotropic conductive layers by selectively pressing thereof, it is not necessary the conductive paste to form the external electrodes or to connect both the internal electrodes and the external electrodes, thereby it can prevent conducive inferiority and insulative inferiority from being yielded.

The above and further objects and novel features of the invention will more fully appear from the following detailed description when the same is read in connection with the accompanying drawings. It is to be expressly understood, however, that the drawings are for purpose of illustration only and not intended as a definition of the limits of the invention.

BRIEF DESCRIPTION OF THE DRAWINGS

The invention will be described with reference to the following drawings, wherein.

DETAILED DESCRIPTION OF THE PREFERRED EMBODIMENTS

A detailed description of the first preferred embodiment of the present invention will be given referring to the accompanying drawings.

Figure 1:
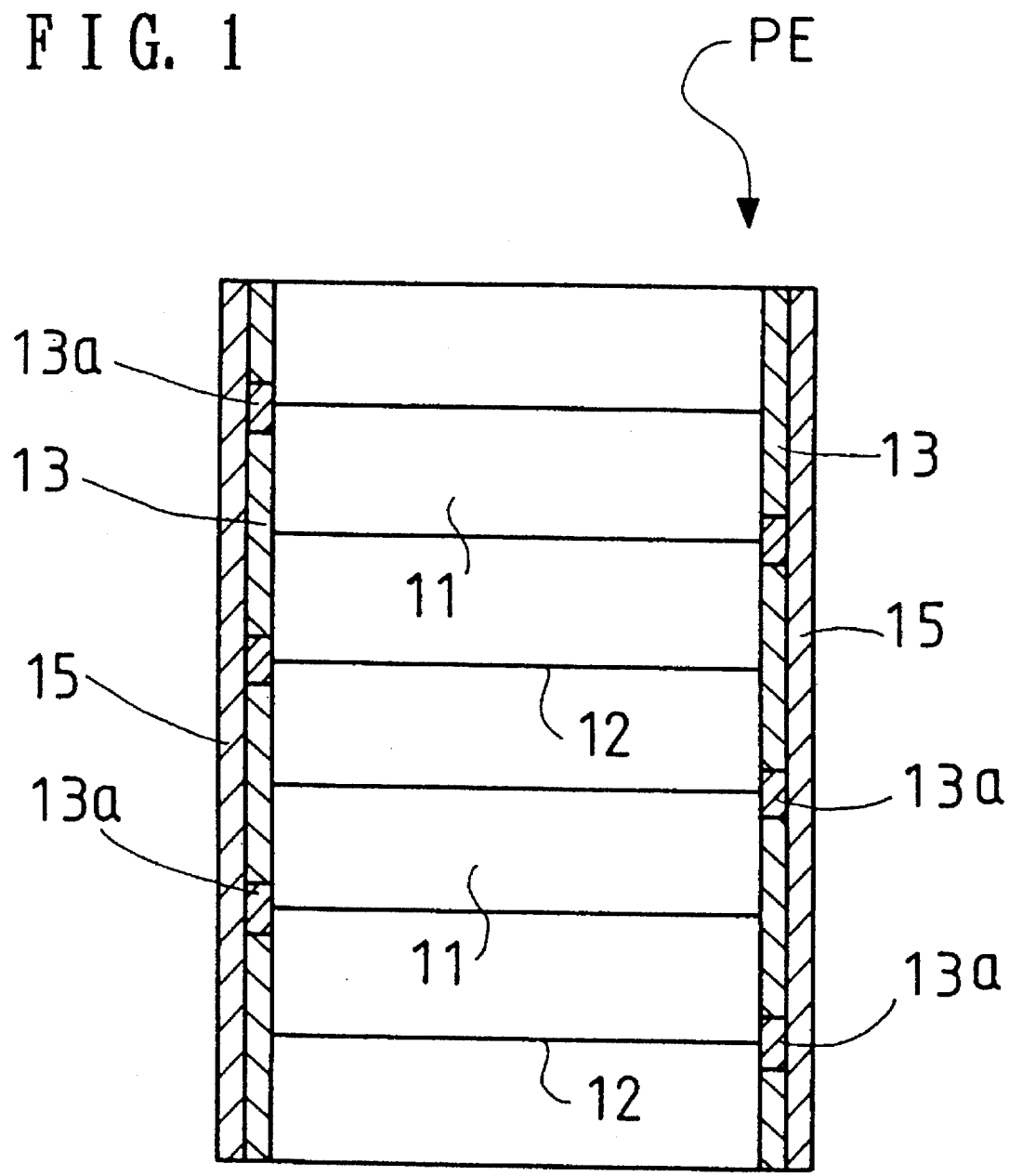
FIG. 1 is a sectional view of a multilayer piezoelectric element according to the first embodiment of the present invention.

In FIG. 1, a multilayer piezoelectric element PE is constructed by alternately stacking a plurality of piezoelectric plates 11 and a plurality of internal electrodes 12. The piezoelectric element PE has four side surfaces and on each side surface the piezoelectric plates 11 and the internal electrodes 12 are exposed. And on two side surfaces which opposes with each other, anisotropic conductive films 13 (so-called, anisotropic connector constructed of resin film) are attached along a stacking direction of the piezoelectric plates 11 (vertical direction in FIG. 1) so that the anisotropic conductive films 13 cover all of the piezoelectric plates 11 exposed on each of the two side surfaces.

And in each of the anisotropic conductive films 13, a plurality of conductive portions 13a are alternately formed as shown in FIG. 1. In FIG. 1, that is to say, in the left anisotropic conductive film 13, three conductive portions 13a in a first group are formed at positions, each corresponding to the first internal electrode 12, the third internal electrode 12 and the fifth internal electrode 12, from the upper surface of the element PE respectively. And in the right anisotropic conductive film 13, three conductive portions 13a in a second group are formed at positions, each corresponding to the second internal electrode 12, the fourth internal electrode 12 and the sixth internal electrode 12, from the upper surface of the element PE respectively. That is to say, the conductive portions 13a are formed every other internal electrode 12 at both sides of the piezoelectric element PE. Manufacturing process of the conductive portions 13a will be described hereinafter.

Further, on each of the anisotropic conductive films 13, a copper foil 15 is adhered. The copper foil 15 acts as an external electrode. Based on that the copper foils 15 are formed on the anisotropic conductive films 13, the first, the third and the fifth internal electrodes 12 are electrically connected to the copper foil 15 formed on the left anisotropic conductive film is through the conductive portions 13a and the second, the fourth and the sixth internal electrodes 12 are electrically connected to the copper foil 15 formed on the right anisotropic conductive film 13 through the conductive portions 13a.

Figure 2:
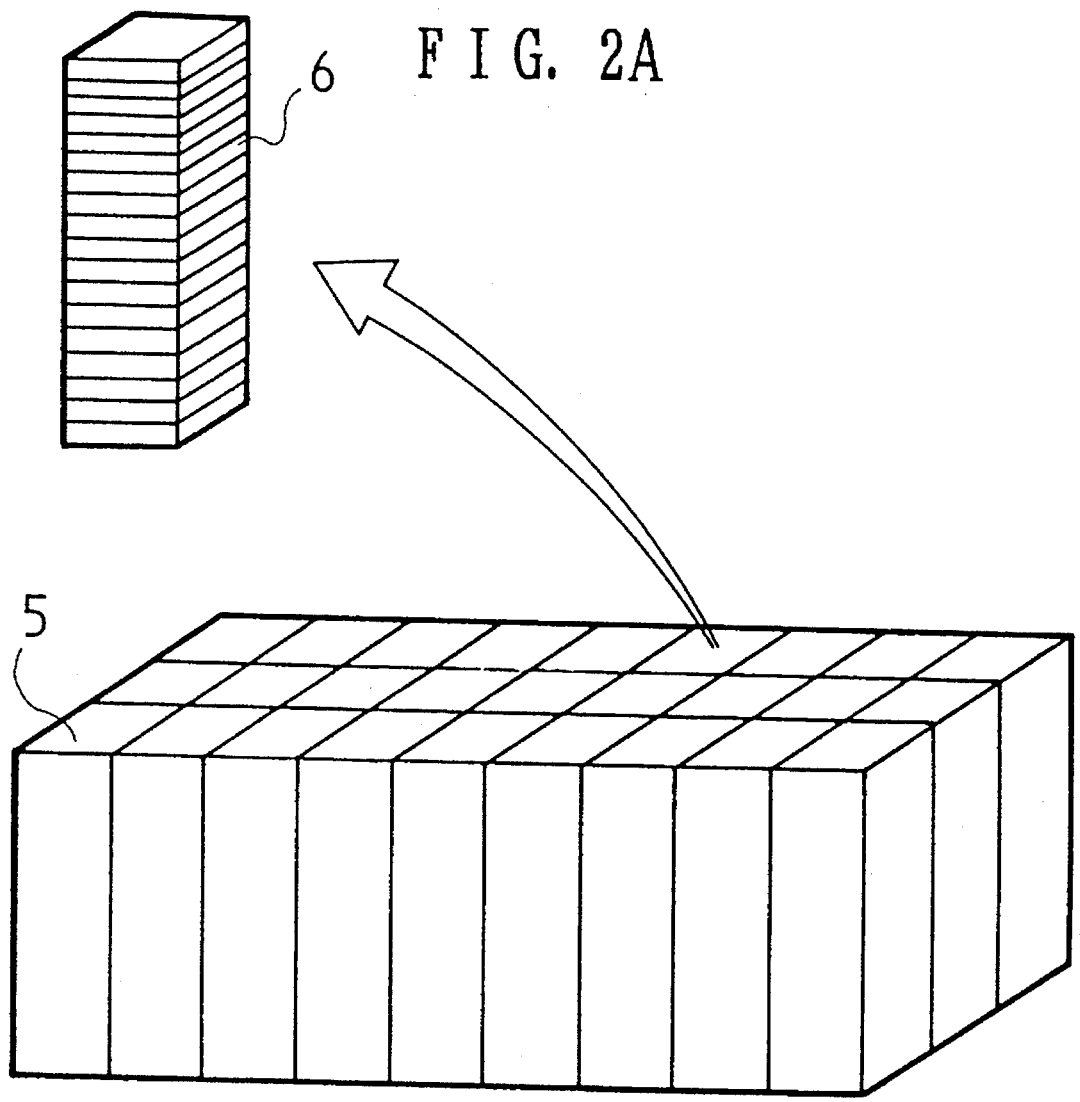
FIG. 2 is a schematic view to explain a state where one multilayer piezoelectric element is cut out from a baked multilayer block.

Next, manufacturing process of the multilayer piezoelectric element PE shown in FIG. 1 will be described referring to FIGS. 2 and 3.

At first, piezoelectric material including PZT (which is compound of lead titanate and lead zirconate) as main component is prepared in a desired composition and thereafter the piezoelectric material is ground into powder after being provisionally baked at 850° C. And binder of 5 weight parts, plasticizer and defoaming agent of trace quantity are added to the powder of the piezoelectric material and thereafter dispersed in organic solvent into slurry state. And the thus obtained slurry is formed into a sheet form with a predetermined thickness by using doctor-blade method, thereby a green sheet, which is utilized to form the piezoelectric plates 11, is obtained.

Thereafter, palladium (Pd) paste is coated on the green sheet by screen printing method so as to form the internal electrode 12. Here, instead of the palladium paste, it is utilizable conductive paste including noble metal such as silver or platinum. The green sheet with palladium paste thereon is punched into a predetermined size. A plurality of the punched green sheets are stacked with each other and hot-pressed into one body. After cleaning thereof, the stacked body is baked at about 1200° C. and a baked multilayer block 5 is obtained as shown in FIG. 2. The multilayer block 5 is sliced into a plurality of element units 6.

On the other hand, the anisotropic conductive film 13 and the copper foil 15 are laminated with each other and the laminated sheet is cut with a width narrower than that of the element unit 6, then the laminated sheets which are cut out are provisionally adhered onto two side surfaces of the element unit 6, each side surface opposing with each other, so that the laminated sheet covers all of the piezoelectric plates 11 exposed thereon.

Here, the anisotropic conductive film 13, in general, can be hot-pressed to the other material and can form the conductive portions 13a, which has conductivity along to one direction, only at pressed portions when the film 13 is selectively pressed.

Figure 3:
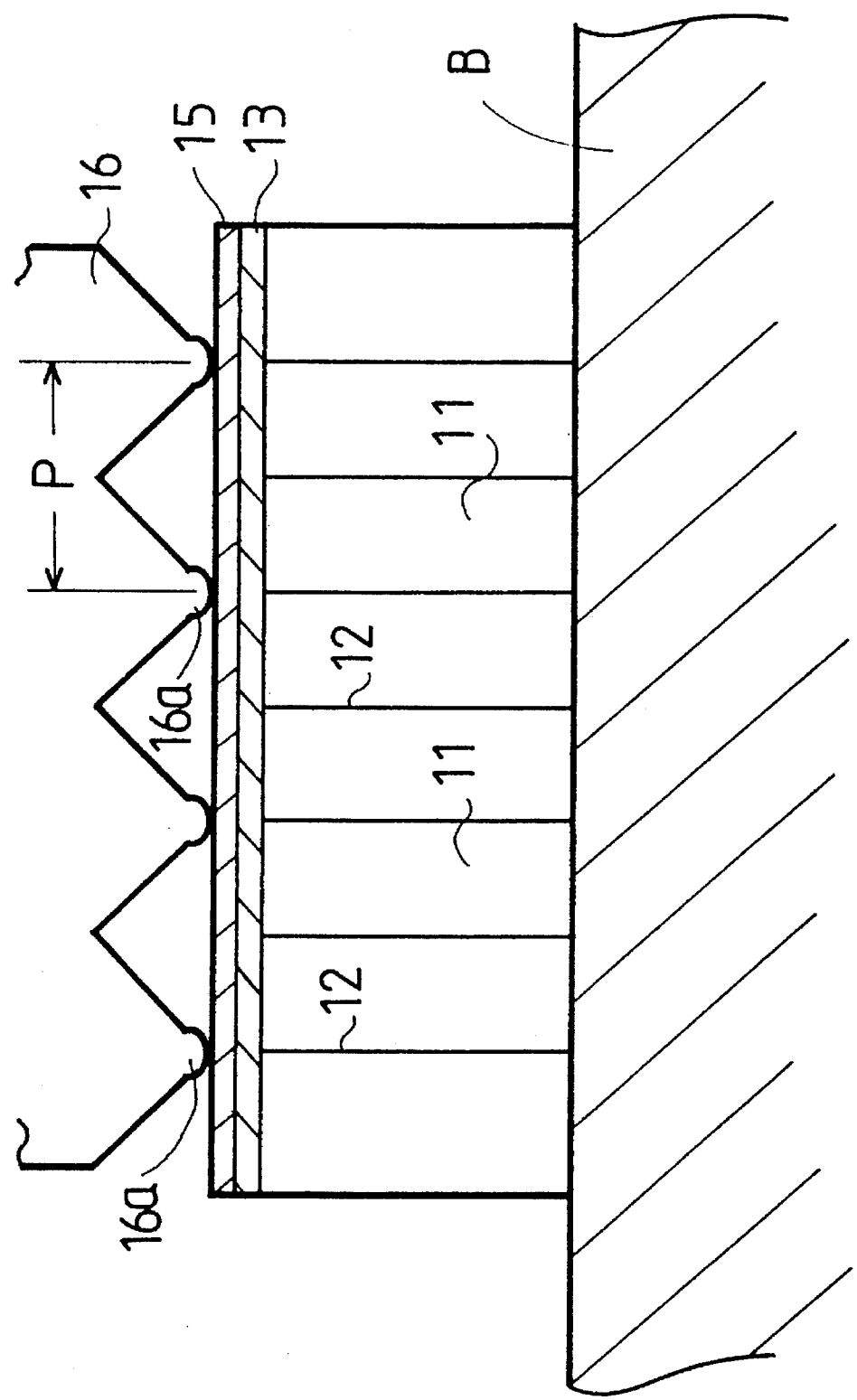
FIG. 3 is a schematic view to explain a state where an anisotropic conductive layer attached to a side surface of the multilayer piezoelectric element is selectively pressed.

And as shown in FIG. 3, the laminated sheet having the anisotropic conductive film 13 and the copper foil 15 is selectively pressed by using a pressing device 16. Here, in the pressing device 16, a plurality of projections 16a, each projection 16a being formed so that the top portion has an arc shape with radius R of about 0.05 mm, are formed on a pressing surface and the projections 16a are arranged thereon with a pitch P corresponding to a twice distance between the internal electrodes 12.

At the time that the laminated sheet is pressed, the projections 16a are positioned so that each projection 16a alternately corresponds to the internal electrode 12 and thereafter the laminated sheet is heated at 180° C. for several seconds while predetermined weight is loaded through the pressing device 16. As a result, only pressed portions in the anisotropic conductive film 13 conclude to have conductivity and such portions become the conductive portions 13a. At this time, the conductive portions 13a are electrically connected to the copper foil 15 which acts as the external electrode as shown in FIG. 1. Therefore, supposing that the laminated sheet is adhered, for example, onto the left side surface of the multilayer piezoelectric element PE, the first, the third and the fifth internal electrodes 12 are alternately connected to the copper foil 15 through the conductive portions 13a.

In addition to the above, the same laminated sheet having the anisotropic conductive film 13 and the copper foil 15 is selectively pressed on the other side surface of the multilayer piezoelectric element PE by using the pressing device 16, according to the same manner mentioned above. Therefore, as shown in FIG. 1, supposing that the laminated sheet is adhered, for example, onto the right side surface of the multilayer piezoelectric element PE, the second, the fourth and the sixth internal electrodes 12 are alternately connected to the copper foil 15 through the conductive portions 13a.

In such case, since the anisotropic conductive film 13 already adhered onto one surface (the left side surface) of the element PE is set on a base B (see FIG. 3) so that the anisotropic conductive film 13 is arranged at the lower position, pressure is loaded to the anisotropic conductive film 13 when the anisotropic conductive film 13 on the other surface (the right side surface) of the element PE is pressed by the pressing device 16. However, the pressure is entirely loaded over the anisotropic conductive film 13, thus only the small pressure is locally loaded. As a result, it is unnecessary to fear that non-conductive portions (that is, portions except for the conductive portions 13a) in the anisotropic conductive film 13 adhered onto one surface of the element PE become conductive.

Thereafter, lead line for supplying voltage is attached to a part of the copper foil 15 and the thus constructed multilayer piezoelectric element PE is polarized and installed in a cover case.

Next, a detailed description of the second preferred embodiment of the present invention will be given hereinafter.

Figure 4:
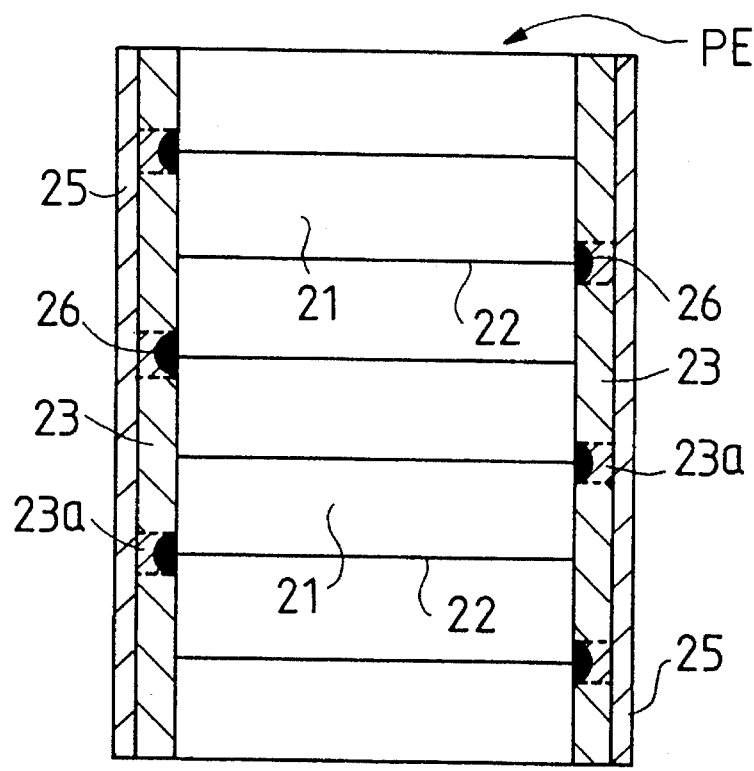
FIG. 4 is a sectional view of a multilayer piezoelectric element according to the second embodiment of the present invention.
Figure 5:
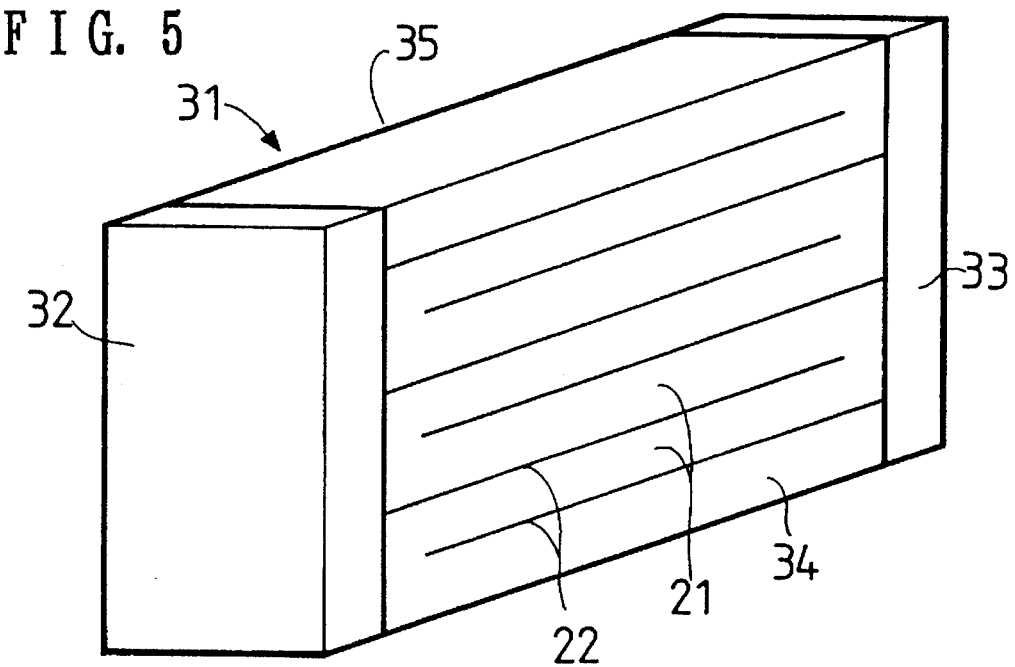
FIG. 5 is a perspective view of a baked multilayer block.
Figure 6:
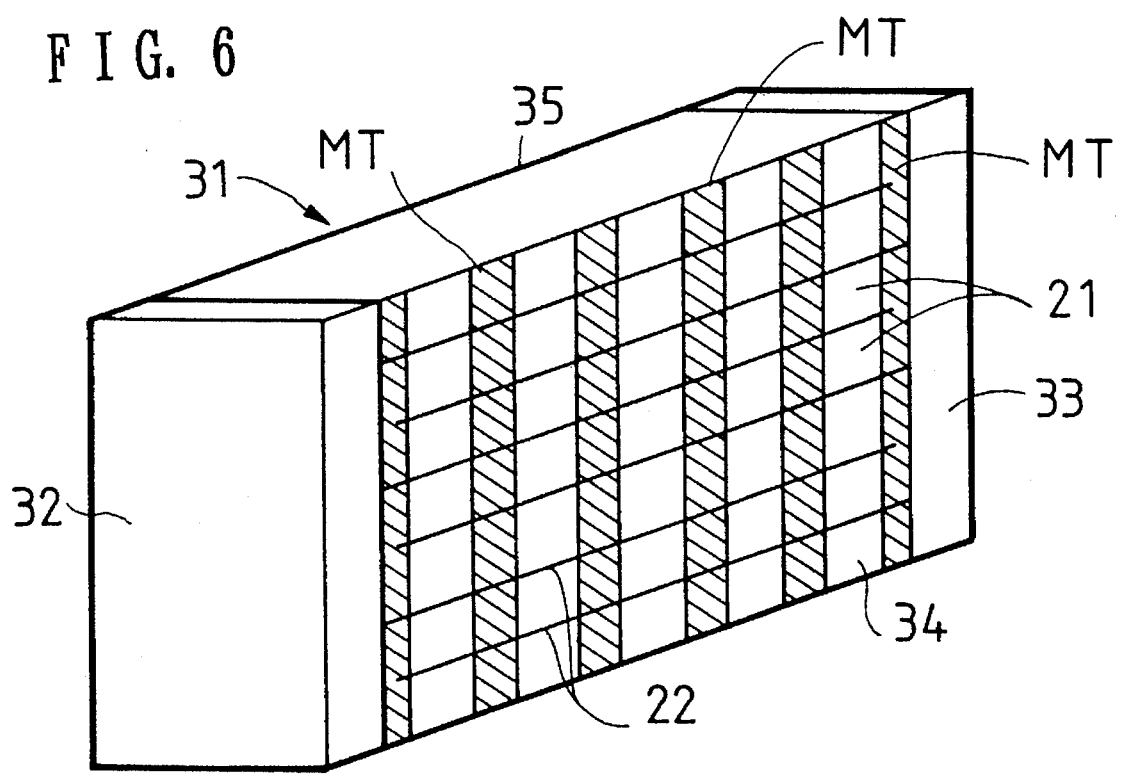
FIG. 6 is a perspective view showing a state where the baked multilayer block is masked by masking tapes.

In FIG. 4, a multilayer piezoelectric element PE is constructed by alternately stacking a plurality of piezoelectric plates 21 and a plurality of internal electrodes 22. The piezoelectric element PE has four side surfaces and on each side surface, the piezoelectric plates 21 and the internal electrodes 22 are exposed. And on two side surfaces which opposes with each other, a plurality of conductive protrusions 26 are alternately formed as shown in FIG. 4. In FIG. 4, that is to say, on the left side surface of the element PE, three conductive protrusions 26 in a first group are formed at positions, each corresponding to the first internal electrode 22, the third internal electrode 22 and the fifth internal electrode 22, from the upper surface of the element PE respectively. And on the right side surface of the element PE, three conductive protrusions 26 in a second group are formed at positions, each corresponding to the second internal electrode 22, the fourth internal electrode 22 and the sixth internal electrode 22, from the upper surface of the element PE respectively.

And on the two side surfaces mentioned above, anisotropic conductive films 23 are attached along a stacking direction of the piezoelectric plates 21 (vertical direction in FIG. 4) so that the anisotropic conductive films 23 cover all of the piezoelectric plates 21 exposed on each of the two side surfaces.

Further, in each of the anisotropic conductive films 23, a plurality of conductive portions 23a are alternately formed so that each conductive portion 23a corresponds and connects to each conductive protrusion 26, as shown in FIG. 4. In FIG. 4, that is to say, in the left anisotropic conductive film 23, three conductive portions 23a are formed at positions, each corresponding to the first conductive protrusion 26, the third conductive protrusion 26 and the fifth conductive protrusion 26, respectively. And in the right anisotropic conductive film 23, three conductive portions 23a are formed at positions, each corresponding to the second conductive protrusion 26, the fourth conductive protrusion 26 and the sixth conductive protrusion 26, respectively. Manufacturing process of the conductive protrusions 26 and the conductive portions 13a will be described hereinafter.

Further, on each of the anisotropic conductive film 23, a copper foil 25 is adhered. The copper foil 25 acts as an external electrode. Based on that the copper foils 25 are formed on the anisotropic conductive films 23, the first, the third and the fifth internal electrodes 22 are electrically connected to the copper foil 25 formed on the left anisotropic conductive film 23 through the conductive protrusions 26 and the conductive portions 23a and the second, the fourth and the sixth internal electrodes 22 are electrically connected to the copper foil 25 formed on the right anisotropic conductive film 23 through the conductive protrusions 26 and the conductive portions 13a.

Next, manufacturing process of the multilayer piezoelectric element PE shown in FIG. 4 will be described referring to FIG. 5 through FIG. 9.

At first, piezoelectric material including PZT as main component is prepared in a desired composition and thereafter the piezoelectric material is ground into powder after being provisionally baked at 850° C. And binder of 5 weight parts, plasticizer and defoaming agent of trace quantity are added to the powder of the piezoelectric material and thereafter dispersed in organic solvent into slurry state. And the thus obtained slurry is formed into a sheet form with a predetermined thickness by using doctor-blade method, thereby a green sheet, which is utilized to form the piezoelectric plates 21, is obtained.

Thereafter, palladium (Pd) paste is coated on the green sheet by screen printing method so as to form the internal electrode 22. The green sheet with palladium paste thereon is punched into a predetermined size. A plurality of the punched green sheets are stacked with each other and hot-pressed into one body. After cleaning thereof, the stacked body is baked at about 1200° C. and a baked multilayer block 31 is obtained. The thus formed multilayer block is sliced so that the internal electrodes 22 are alternately disposed on the side surfaces thereof. Thereafter, provisional external electrodes 32 and 33 are formed on the two end portions 32, 33 (the left end and the right end in FIG. 5) by coating and baking the conductive paste. Further, the multilayer block 31 is sliced so that another pair of surfaces 34, 35 (the front surface and the back surface in FIG. 5) are exposed.

Figure 7:
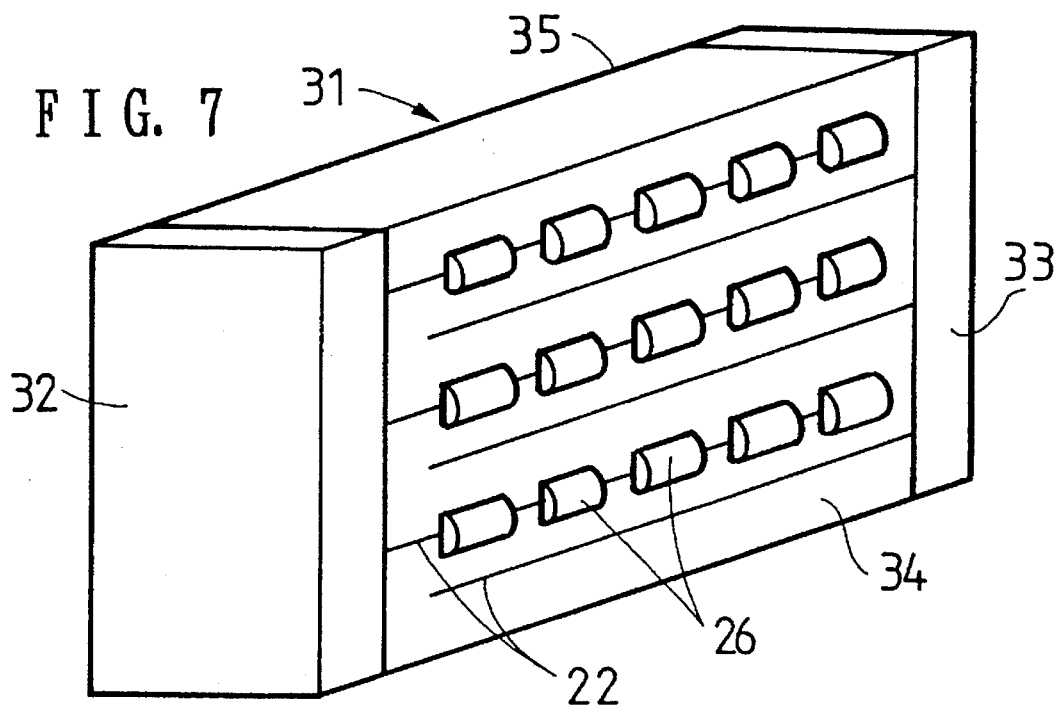
FIG. 7 is a perspective view showing a state where conductive protrusions are formed on end portions that internal electrodes are exposed on the side surface of the piezoelectric element.
Figure 8:
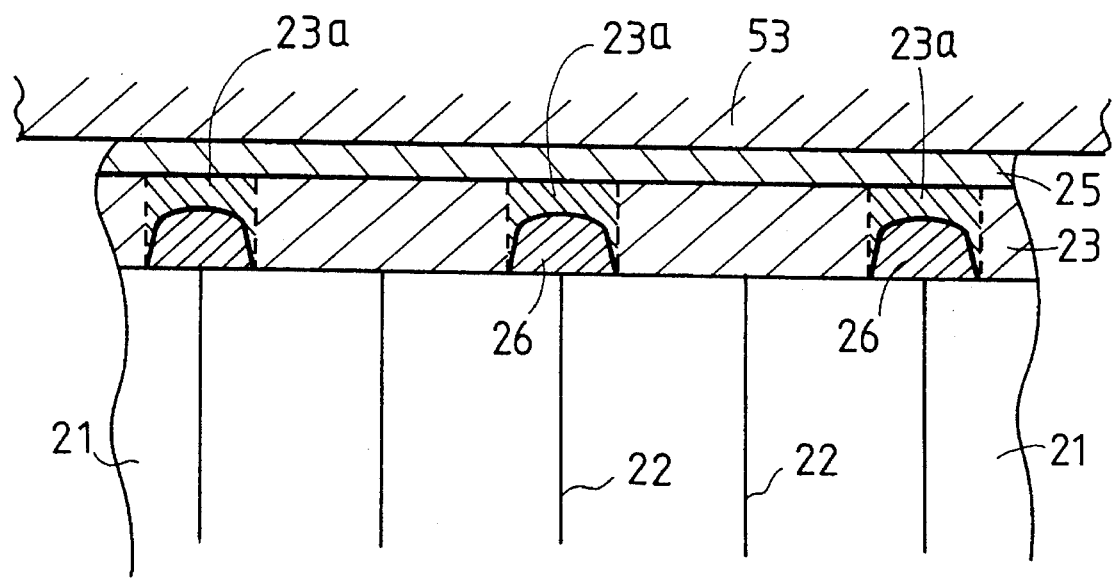
FIG. 8 is a schematic view to explain a state where the anisotropic conductive film and a copper foil on the anisotropic conductive film are pressed.

And as shown in FIG. 8, the surface 34 of the multilayer block 31 is partially masked by masking tapes MT so that the parts of the surface 34 where the conductive protrusions 28 will be formed are exposed and the parts thereof where the conductive protrusions 28 will not be formed are masked. Similarly, the other surface 35 of the multilayer block 31 is entirely masked by the masking tapes MT. Thereafter, the external electrode 32 is connected to a negative electrode of a direct current source and the multilayer block 31 is bathed in a nickel plating bath. While retaining this state, direct current of 50 mA is applied to the external electrode 32 for about five (5) minutes. As a result, on end surfaces of the internal electrodes 22 which connected to the external electrode 32, nickel plating layer is produced. And after the masking tapes MT are peeled from the surface 34, the conductive protrusions 28 composed of nickel are alternately obtained as shown in FIG. 7.

Similarly to the above, the surface 34 of the multilayer block 31 where the protrusions 28 are formed is entirely masked and the opposite surface 35 thereof is partially masked by the masking tapes MT. Thereafter, direct current of 50 mA is applied to the external electrode 32 for about five (5) minutes. As a result, on end surfaces of the internal electrodes 22 which connected to the external electrode 32, nickel plating layer is produced. And after the masking tapes MT are peeled from the surface 34, the conductive protrusions 28 composed of nickel are alternately obtained. Here, the conductive protrusions 38 on the surface 35 are alternately formed on end surfaces of the different internal electrodes 22 as shown in FIG. 4.

Figure 9:
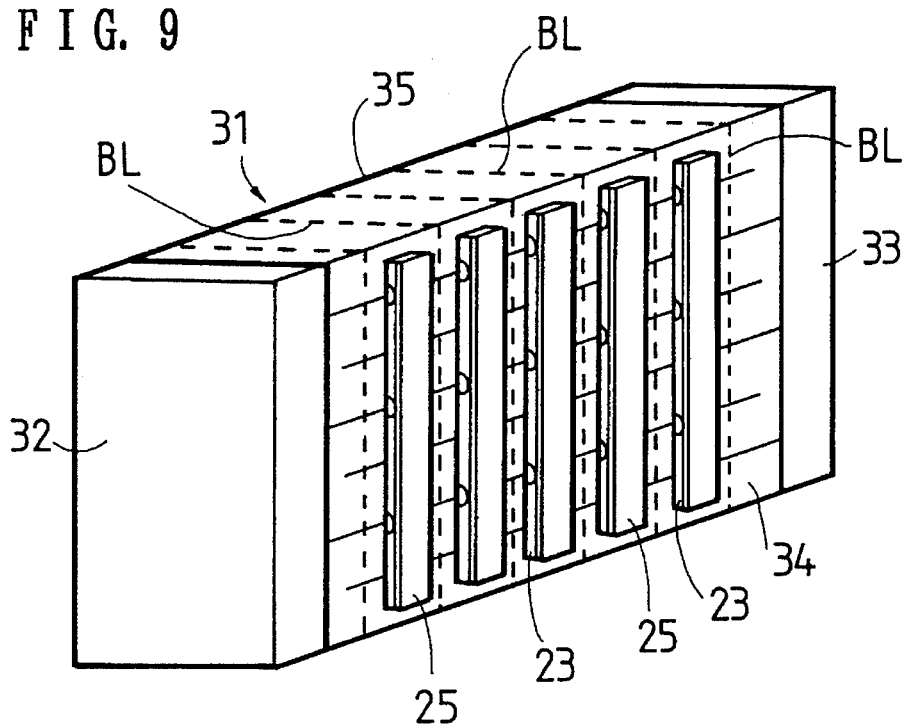
FIG. 9 is a perspective view of the baked multilayer block after the anisotropic conductive film and the copper foil are formed on the side surface of the block.
Figure 10:
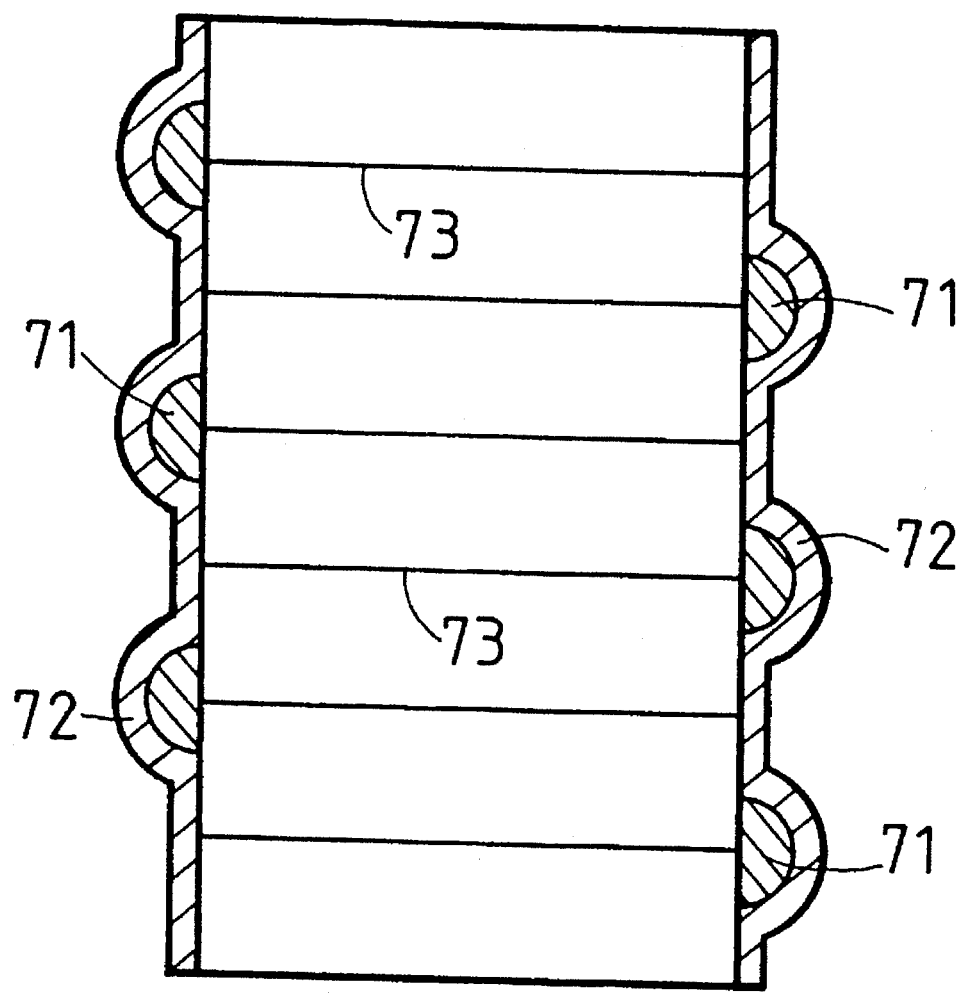
FIG. 10 is a sectional view of a conventional multilayer piezoelectric element.
Figure 11A:
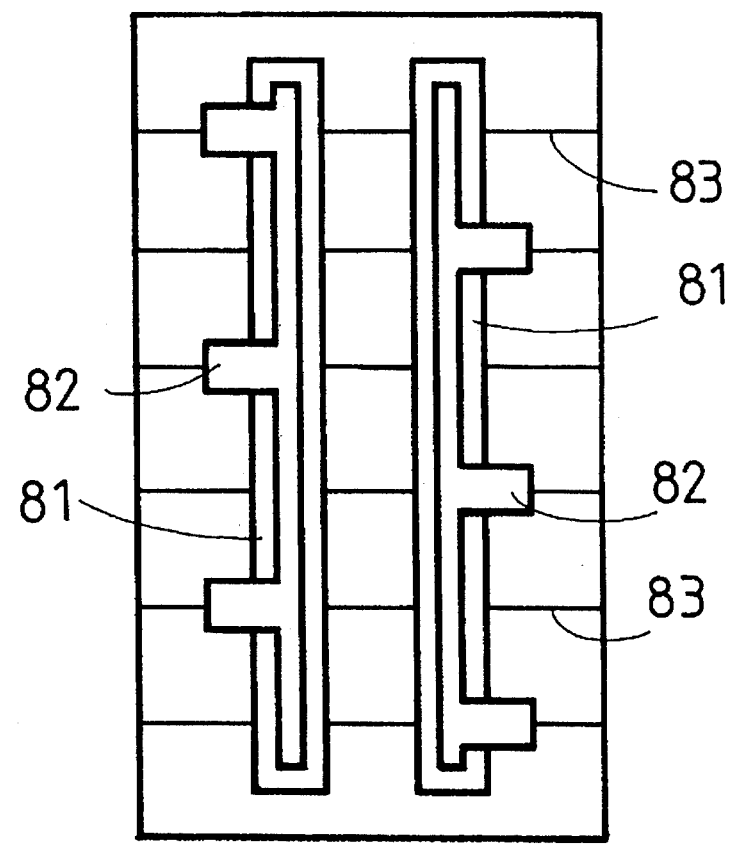
FIG. 11 is a schematic view of the other conventional multilayer piezoelectric element, wherein FIG. 11 (a) is a side view of the element and FIG. 11 (b) is a sectional view of the element.
Figure 11B:
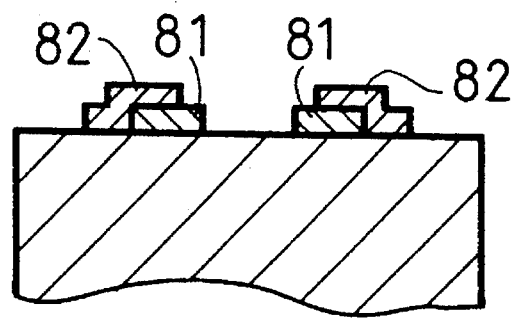

On the other hand, the anisotropic conductive film 33 and the copper foil 25 are laminated with each other and the laminated sheet is cut with a width narrower than that of the piezoelectric element PE which will be obtained by slicing the multilayer block 31 as shown in FIG. 9 (mentioned hereinafter), then the laminated sheets which are cut out are provisionally adhered onto two side surfaces 34, 35 of the multilayer block 31, each side surface 34, 35 opposing with each other, so that the laminated sheet covers over all of the piezoelectric plates 21 exposed in the element PE.

Here, the anisotropic conductive film 23, in general, can be hot-pressed to the other material and can form the conductive portions 23a, which has conductivity along to one direction, only at pressed portions when the film 23 is selectively pressed.

And after the laminated sheets obtained above are attached on both side surfaces of the multilayer block 31, they are clamped and hot-pressed with weight of several kg from the both side surfaces by a pair of flat pressing devices 53 (one device 53 is shown in FIG. 8) which are heated at about 180° C. Thereby, the anisotropic conductive film 23 in the laminated sheet is pressed so that only the portions opposing to the conductive protrusions 26 are partially pressed with higher pressure than that loaded onto the other portions thereof. As a result, only the pressed portions conclude to have conductivity and become conductive portions 23a as shown in FIGS. 4 and 8. Therefore, the internal electrodes 22 are alternately connected to the copper foil 25 through the conductive protrusions 26 and the conductive portions 23a.

The thus obtained multilayer block 31 is sliced according to broken lines BL shown in FIG. 9 and a plurality of the multilayer piezoelectric element PE are cut out therefrom. Further, lead line for supplying voltage is attached to a part of the copper foil 15 and the thus constructed multilayer piezoelectric element PE is polarized and installed in a cover case.

While the invention has been particularly shown and described with reference to preferred embodiments thereof, it will be understood by those skilled in the art that the foregoing and other changes in form and details can be made therein without departing from the spirit and scope of the invention.

For instance, in the first embodiment, it is conceivable that the element unit 8 on two side surfaces of which the anisotropic conductive film 13 and the copper foil 15 are hot-pressed, will be clamped and pressed by a pair of the pressing devices 16 from the both side surfaces so that the projections 16a in one of the devices 16 are positioned at concave portions (formed between the projections 16a) in the other device 16. In such case, two side surfaces of the element unit can be pressed at the same time. And in case that one of the copper foil 15 is extended, the extended portion of the copper foil 15 can use as the lead line.

Further, in the second embodiment, though the conductive protrusions 26 are formed by nickel plating, chromium plating or copper plating can be utilized to form the conductive protrusions 26 instead of nickel plating. And it is conceivable that conductive tape can be used instead of the copper foil 25.

What is claimed is:

1. A multilayer piezoelectric element having a first and a second side surfaces opposing with each other in which a plurality of piezoelectric layers and a plurality of internal electrodes are alternately stacked with each other, the multilayer piezoelectric element comprising:

a pair of anisotropic conductive layers which are formed on the first and the second side surfaces of the multilayer piezoelectric element so as to cover the internal electrodes exposed on the first and the second side surfaces, the anisotropic conductive layer being capable of becoming conductive only at points where selectively pressed and having conductive portions formed therein by being selectively pressed through a pressing device; and a pair of external electrodes which are formed on the anisotropic conductive layers on both the first and the second side surfaces, the external electrode being electrically connected to the internal electrodes through the conductive portions formed in the anisotropic conductive layer.

2. The multilayer piezoelectric element according to claim 1, wherein the conductive portions are alternately formed in the anisotropic conductive layer on the first side surface corresponding to a first group of the internal electrodes and the conductive portions are alternately formed in the anisotropic conductive layer on the second side surface corresponding to a second group of the internal electrodes different from the internal electrodes in the first group.

3. The multilayer piezoelectric element according to claim 1, wherein the piezoelectric layer is composed of piezoelectric material including PZT as a main component.

4. The multilayer piezoelectric element according to claim 1, wherein the internal electrode is formed by coating conductive paste on the piezoelectric layer.

5. The multilayer piezoelectric element according to claim 4, wherein the conductive paste is noble metal paste.

6. The multilayer piezoelectric element according to claim 5, wherein the noble metal paste is one of palladium paste, silver paste and platinum paste.

7. The multilayer piezoelectric element according to claim 1, wherein the anisotropic conductive layer is formed by attaching an anisotropic conductive film onto the first or the second side surface.

8. The multilayer piezoelectric element according to claim 1, wherein the external electrode is formed from copper foil hot-pressed onto the anisotropic conductive layer.

9. A multilayer piezoelectric element having a first and a second side surfaces opposing with each other in which a plurality of piezoelectric layers and a plurality of internal electrodes are alternately stacked with each other, the multilayer piezoelectric element comprising:

a plurality of conductive protrusions alternately formed at end positions of the internal electrodes exposed on both of the first and second side surfaces;

a pair of anisotropic conductive layers which are formed on the first and the second side surfaces of the multilayer piezoelectric element so as to cover the internal electrodes exposed on the first and the second side surfaces, the anisotropic conductive layer being capable of becoming conductive only at points where selectively pressed and having conductive portions formed therein by being selectively pressed through a pressing device; and a pair of external electrodes which are formed on the anisotropic conductive layers on both the first and the second side surfaces, the external electrode being electrically connected to the internal electrodes through the conductive protrusions and the conductive portions.

10. The multilayer piezoelectric element according to claim 9, wherein the conductive protrusions are formed corresponding to a first group of the internal electrodes exposed on the first side surface and the conductive protrusions are formed corresponding to a second group of the internal electrodes on the second side surface different from the internal electrodes in the first group.

11. The multilayer piezoelectric element according to claim 10, wherein the conductive portions are formed in the anisotropic conductive layer by being pressed in cooperation with the conductive protrusions when pressed through the pressing device.

12. The multilayer piezoelectric element according to claim 11, wherein the conductive portions formed in the anisotropic conductive layer on the first side surface corresponds to the conductive protrusions on the first side surface and the conductive portions formed in the anisotropic conductive layer on the second side surface corresponds to the conductive protrusions on the second side surface.

13. The multilayer piezoelectric element according to claim 10, wherein the conductive protrusions are formed by metal plating.

14. The multilayer piezoelectric element according to claim 13, wherein the metal plating is nickel plating.

* * * * *